United States Patent [19]
Guedj

[11] Patent Number: 6,118,315
[45] Date of Patent: Sep. 12, 2000

[54] POWER-ON-RESET CIRCUIT PROVIDING PROTECTION AGAINST POWER SUPPLY INTERRUPTIONS

[75] Inventor: Marc Guedj, Aix en Provence, France

[73] Assignee: SGS-Thomson Microelectronics S.A., Gentilly, France

[21] Appl. No.: 08/908,583

[22] Filed: Aug. 8, 1997

Related U.S. Application Data

[63] Continuation of application No. 08/166,970, Dec. 14, 1993, abandoned.

[30] Foreign Application Priority Data

Dec. 22, 1992 [FR] France .................................. 92 15522

[51] Int. Cl.$^7$ .................................................. H03K 17/22
[52] U.S. Cl. ........................................... 327/143; 327/198
[58] Field of Search .............................. 327/78, 143, 198

[56] References Cited

U.S. PATENT DOCUMENTS

| | | | |
|---|---|---|---|
| 4,096,560 | 6/1978 | Footh ......................................... | 364/200 |
| 4,260,907 | 4/1981 | Winebarger .............................. | 327/143 |
| 4,446,381 | 5/1984 | Dalrymple ................................ | 327/143 |
| 4,451,742 | 5/1984 | Aswell . | |
| 4,748,352 | 5/1988 | Kamiya et al. ........................... | 327/143 |
| 4,886,984 | 12/1989 | Nakaoka .................................. | 327/143 |
| 4,902,910 | 2/1990 | Hsieh ....................................... | 327/143 |
| 5,151,614 | 9/1992 | Yamazaki et al. ....................... | 327/143 |
| 5,164,613 | 11/1992 | Mumper et al. ......................... | 327/143 |
| 5,180,926 | 1/1993 | Skripek ................................... | 327/143 |
| 5,319,601 | 6/1994 | Kawata et al. ........................... | 327/143 |
| 5,321,317 | 6/1994 | Pascucci et al. ........................ | 327/143 |
| 5,369,310 | 11/1994 | Badyal et al. ........................... | 327/143 |

OTHER PUBLICATIONS

DS1210 Datasheet from 1989 Dallas Semiconductor Databook.

DS5000 User's Guide (Chapter 6) (V2.0 1990) (Dallas Semiconductor).

Japanese Journal of Applied Physics, Supplements 17th Conference on Solid State Devices and Materials, Aug. 25, 1985, pp. 49–52.

Sawada et al., On–Chip Battery Back–Up Circuit for VLSI Static RAM's.

*Primary Examiner*—Terry D. Cunningham
*Attorney, Agent, or Firm*—Theodore E. Galanthay; Fleit, Kain, Gibbons, Gutman & Bongini P.L.

[57] ABSTRACT

The disclosure relates to integrated circuits and, more particularly, to a power-on-reset circuit. The proposed circuit produces an inhibition signal when the power is turned on, this signal being interrupted after the supply voltage Vcc has reached a first threshold (VS1) (VS1). Furthermore, the circuit has means to re-trigger the inhibition signal when the supply voltage drops by a certain value, in doing so even if the supply voltage remains above the first threshold. The reliability of the integrated circuit is improved. The disclosed circuit is particularly applicable to the inhibition of the writing circuit of an EEPROM memory.

36 Claims, 3 Drawing Sheets

POWER-ON-RESET CIRCUIT PROVIDING PROTECTION AGAINST POWER SUPPLY INTERRUPTIONS

This application is a continuation of application Ser. No. 08/166,970, filed Dec. 14, 1993 and now abandoned.

BACKGROUND OF THE INVENTION

1. Field of the Invention

The invention relates to integrated circuits and more specifically to a starting circuit or power-on-reset circuit that can be used for the temporary inhibition of certain functions of the integrated circuit when the power is being turned on. Indeed, in certain logic circuits, erroneous operations may be caused by the insufficiency of the power supply. To prevent these erroneous operations, it is preferred to totally inhibit certain functions of the integrated circuit while the power is being turned on.

A power-on-reset circuit is used for this purpose. This circuit produces a signal that starts when the power is turned on and continues until the supply voltage has reached a sufficient value. This square-wave signal is applied to an input for the inhibition of each of the circuits whose operation has to be inhibited temporarily.

Typically, for a nominal supply voltage of five volts, steps are taken to produce an inhibition signal that starts when the power is turned on and generally continues for a period ranging from some milliseconds to some tens of milliseconds after the supply voltage has gone beyond a threshold of about 3 to 3.3 volts which is acceptable for the working of the integrated circuit.

A power-on-reset circuit appears, for example, to be indispensable for non-volatile, electrically erasable and programmable memory (EEPROM) circuits, especially when such a memory is organized into words of several bits that are written or erased in parallel, since there is then a risk of undesirable programming of the memory as a result of unreliable instructions given at the start of the powering of the circuit. This is of critical importance, for example with EEPROM chip card circuits where the contents of the memory have to be perfectly reliable.

2. Description of the Prior Art

In general, in power-on-reset circuits of the prior art, the output voltage of the power-on-reset circuit, namely the voltage applied to an inhibition input of a circuit whose operation has to be prohibited, takes the following course: in the beginning, it follows the supply voltage fairly closely and then, when the supply voltage exceeds a determined threshold, a time delay is triggered so that the inhibition signal lasts for a certain period of time, after which it gets interrupted. If the supply voltage then varies and momentarily falls below the threshold, the inhibition signal may reappear and it then follows the variations of the supply voltage, but without re-triggering a time delay.

It has been observed that, in certain cases, the reliability of the integrated circuit remains insufficient.

SUMMARY OF THE INVENTION

To improve this reliability, the invention proposes a power-on-reset circuit in an integrated circuit supplied with a supply voltage Vcc, the power-on-reset circuit comprising means to produce an inhibition signal when the supply voltage has not yet reached a first voltage threshold, this inhibition signal being applied to an inhibition input of a circuit whose operation is to be inhibited when the power is turned on in the integrated circuit, said power-on-reset circuit further comprising means to re-trigger an inhibition signal when the supply voltage Vcc falls by at least a determined value, this being the case even if the supply voltage then remains above the first threshold.

The power-on-reset circuit then acts also as a protection circuit against the non-negligible variations in the supply voltage.

Typically, for a nominal voltage Vcc of 5 volts, the first threshold is preferably the same as in the prior art, namely about 3 to 3.3 volts. The voltage drop that causes the inhibition signal to be re-triggered is preferably equal to about one volt. If the nominal supply voltage Vcc0 is equal to five volts, it corresponds then to a re-triggering of the inhibition signal for a second threshold of about four volts.

Quite particularly, in the case of EEPROM circuits organized in words of several bits, it has been observed that such a circuit is more reliable than the prior art power-on-reset circuits. The inhibition signal then inhibits the writing circuits in the memory, but it is not necessary for it to inhibit the reading circuits.

Preferably, time delay means are planned so that the inhibition signal gets prolonged for a certain period of time after the supply voltage has gone beyond the first threshold and after the re-triggering under the effect of a drop in supply voltage. This period is short and may be of the order of some milliseconds. After this period, the inhibition signal gets interrupted.

The power-on-reset circuit according to the invention preferably comprises:
- a first threshold-exceeding detector and a second threshold-exceeding detector, both giving a threshold-exceeding signal if the supply voltage goes beyond the threshold;
- a first logic gate receiving the signals coming from these two detectors and flipping over when both circuits give a threshold-exceeding signal;
- a detector of a drop in supply voltage, giving a pulse signal if the supply voltage drops by at least a determined value, the output of this voltage drop detector being connected to a first input of the first logic gate to make this first logic gate flip over momentarily into the reverse direction;
- the output of the first gate giving a signal to control the inhibition signal.

Preferably again, the first threshold-exceeding detector is connected to the first input of the first logic gate and the second threshold-exceeding detector is connected to a second input of this gate. The second detector may be inhibited by a re-triggering signal, and there is provided a second logic gate receiving, firstly, the output of the first gate and, secondly, the output of the voltage drop detection circuit, this second gate giving the re-triggering signal when it receives the pulse signal while the supply voltage is above the threshold.

The output of the first logic gate is preferably connected to an inverter, and a capacitor is preferably placed between this output and a ground. The output of the inverter gives the inhibition signal, and the capacitor is used to set up a delay between the time when the first gate flips over and the time when the inverter flips over and interrupts the inhibition signal.

Preferably again, the second detector has means to delay the transmission of a threshold-exceeding signal with respect to the time when the supply voltage goes beyond this threshold, and with respect to the end of the re-triggering signal.

The voltage drop detection circuit preferably has a first transistor with a very low threshold voltage, having its drain and its control gate connected to the supply voltage and its source connected to a storage capacitor, and a second P channel transistor whose threshold voltage is substantially equal to the voltage drop, the exceeding of which is to be detected, this second transistor having its source connected to the source of the first transistor and to the storage capacitor and having its control gate connected to the supply voltage, its drain constituting the output of the voltage drop detection circuit.

BRIEF DESCRIPTION OF THE DRAWINGS

Other features and advantages of the invention shall appear from the following detailed description, made with reference to the appended drawings, of which.

MORE DETAILED DESCRIPTION

The power-on-reset circuit CD, which can also be called a temporary inhibition circuit, is also known as a starting circuit. It forms part of an integrated circuit IC, for example a memory card circuit comprising an EEPROM type memory MNV.

The memory can be written in or erased by means of a writing automaton CW. The memory must be protected against the writing of erroneous information, especially when the supply voltage is too low, and above all if the memory is organized in words of several bits. The power-on-reset circuit gives an inhibition signal INH that is applied to an inhibition input of the circuit CW to prohibit its operation in this case.

Figure 1:
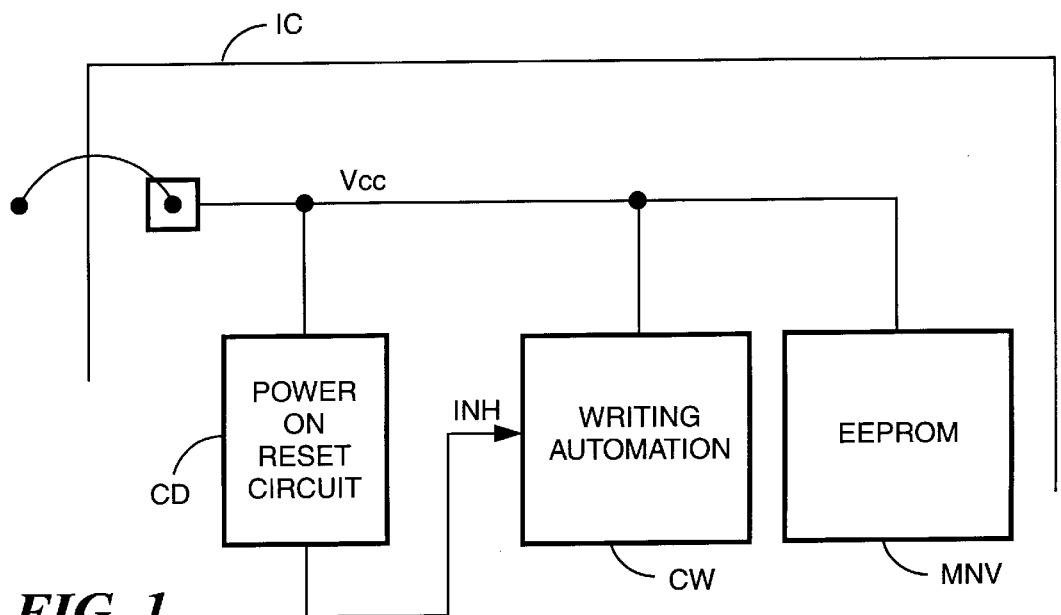
FIG. 1 shows an integrated circuit comprising a power-on-reset circuit.
Figure 2:
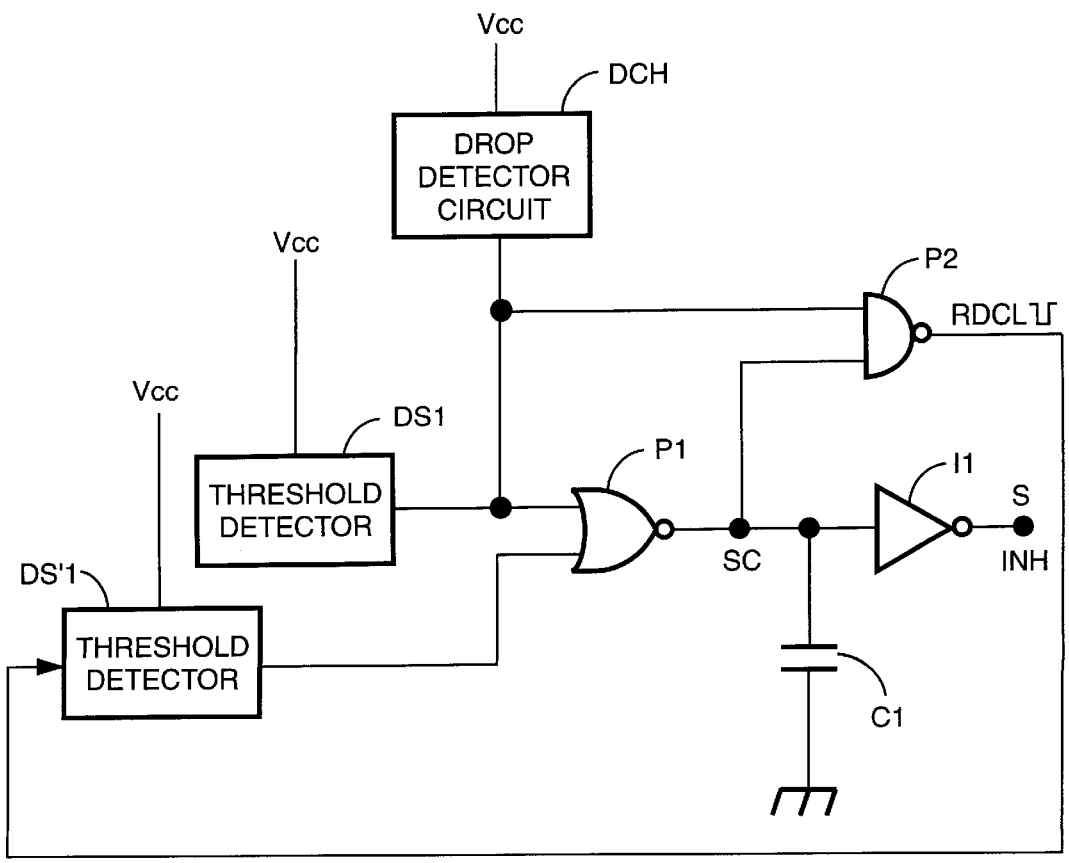
FIG. 2 shows a block diagram of the power-on-reset circuit according to the invention.

A simplified diagram of the power-on-reset circuit according to the invention is shown in FIG. 2.

The power-on-reset circuit has two circuits DS1 and DS'1 for the detection of the exceeding of a voltage threshold VS1. VS1 may be typically have a value of 3 volts to 3.3 volts, for a nominal supply Vcc0 of 5 volts.

Each of these circuits DS1 and DS'1 gives a logic level as a function of the value of the real supply voltage Vcc in relation to VS1. These logic levels are applied to the two inputs of a first logic gate P1. The gate P1, which is preferably a NOR gate, flips over when the two detectors give a low logic level indicating that Vcc has gone beyond VS1. The second detector DS'1 preferably has means to delay the change in state of its output after the instant when Vcc actually goes beyond VS1.

Circuits not shown in FIG. 2 may be designed to ensure that the logic levels at the inputs of the gate P1 are both at the high level when the circuit is started.

The threshold-exceeding detection signal that comes from the circuit DS'1 can be neutralized by an external signal. The low logic level emitted by the circuit DS'1 can therefore be inhibited (replaced by a high logic level or by a high impedance state) even if Vcc is always greater than VS1.

The output of the gate P1 is a logic signal SC that is a control signal for the inhibition signal INH to be produced. It is applied to the input of an inverter I1 whose output S gives the signal INH. A capacitor C1 is placed between the output of the gate P1 and a ground, to delay the downward transition of the signal INH with respect to the upward logic transition of the signal SC.

To summarize what has just been stated: the gate P1 gives a low logic level during the starting, and INH is therefore at the high logic level during this period until Vcc goes beyond the threshold VS1. Then, possibly after a delay introduced by the detector DS'1, the signal SC goes to the high level but, owing to the capacitor C1, the signal INH does not immediately go to zero. The inhibition signal therefore lasts for as long as Vcc remains below VS1 and for a certain period of time beyond that (in general some nanoseconds).

A circuit DCH is provided for the detection of a substantial drop in the voltage Vcc. This circuit is connected between Vcc and one of the inputs of the gate P1, herein the first input, connected to the output of the detection circuit DS1. The circuit DCH gives a short pulse when Vcc falls by a quantity greater than a determined value V1. The short pulse is a rising edge that causes the gate P1 to flip over: prior to this instant, this gate P1 has both its inputs at the low logic level.

The consequence of this flip-over is the swift discharging of the capacitor C1 and hence the starting of an inhibition pulse INH. There is a known way of setting up the output state of the gate P1 so that the discharging of C1 after negative transition of the gate is far quicker than the charging after positive transition.

Furthermore, a second logic gate P2 (in this example a NAND gate) receives firstly the output of the gate P1 and, secondly, the output of the detection circuit DCH which is, at the same time, the output of the circuit DS1. The output of this gate P2 is at the high logic level during the normal starting of the integrated circuit (because either the output of the gate P1 is at the low level or the output of the circuit DS1 is at the low level), and it is also at the high level during the normal operation of the integrated circuit, i.e. when Vcc undergoes no sudden drop in voltage; indeed the output of the circuit DS1 then remains at the low level.

However, if the circuit for the detection of a drop in the voltage Vcc gives a short pulse at the high level in normal operation, i.e. when the signal SC is at the high level, then the gate P2 flips over, and it gives a re-triggering or reinitialization pulse RDCL. This pulse RDCL (downward square-wave pulse) is applied to the second threshold detection circuit DS'1 to neutralize its output despite the fact that Vcc is greater than VS1.

The second circuit DS'1 then stops keeping the second input of the gate P1 at the low level and even makes it possible, by means not shown in FIG. 2, to keep this input at the high level.

Immediately after the end of the short pulse from the circuit DCH, the gate P2 returns to its initial state, the detector DS'1 stops receiving the neutralization signal RDCL, and it resumes its normal function of a Vcc threshold-exceeding detector.

The situation reached then is the same as that immediately after the power has been turned on: the two detectors DS1 and DS'1 give a low logic level with, however, preferably a certain delay for DS'1 in relation to the time when the re-triggering signal RDCL ends. The gate P1 flips over again and, at the end of a period related to the value of the capacitor C1, the inhibition signal INH is again interrupted.

To summarize this part of the operation of the power-on-reset circuit: when Vcc falls at least by a determined value V1 (for example 1 volt), defined by the detector DCH, a short pulse is sent out by the circuit DCH. This pulse makes the gates P1 and P2 flip over. The inhibition signal INH starts. Simultaneously, the threshold detector DS'1 is neutralized. Then the detector DS'1 recovers its normal function and everything happens as in an operation for turning on the power. The signal INH persists until DS'1 has again given a low logic level and the inverter I1 has again flipped over.

The power-on-reset circuit according to the invention therefore acts also as a safety circuit in the event of a major drop in the supply voltage (for example, Vcc goes to 4 volts instead of its nominal value of five volts), and does so even if the supply voltage does not fall below the normal threshold VS1 for restarting the circuit.

Figure 3:
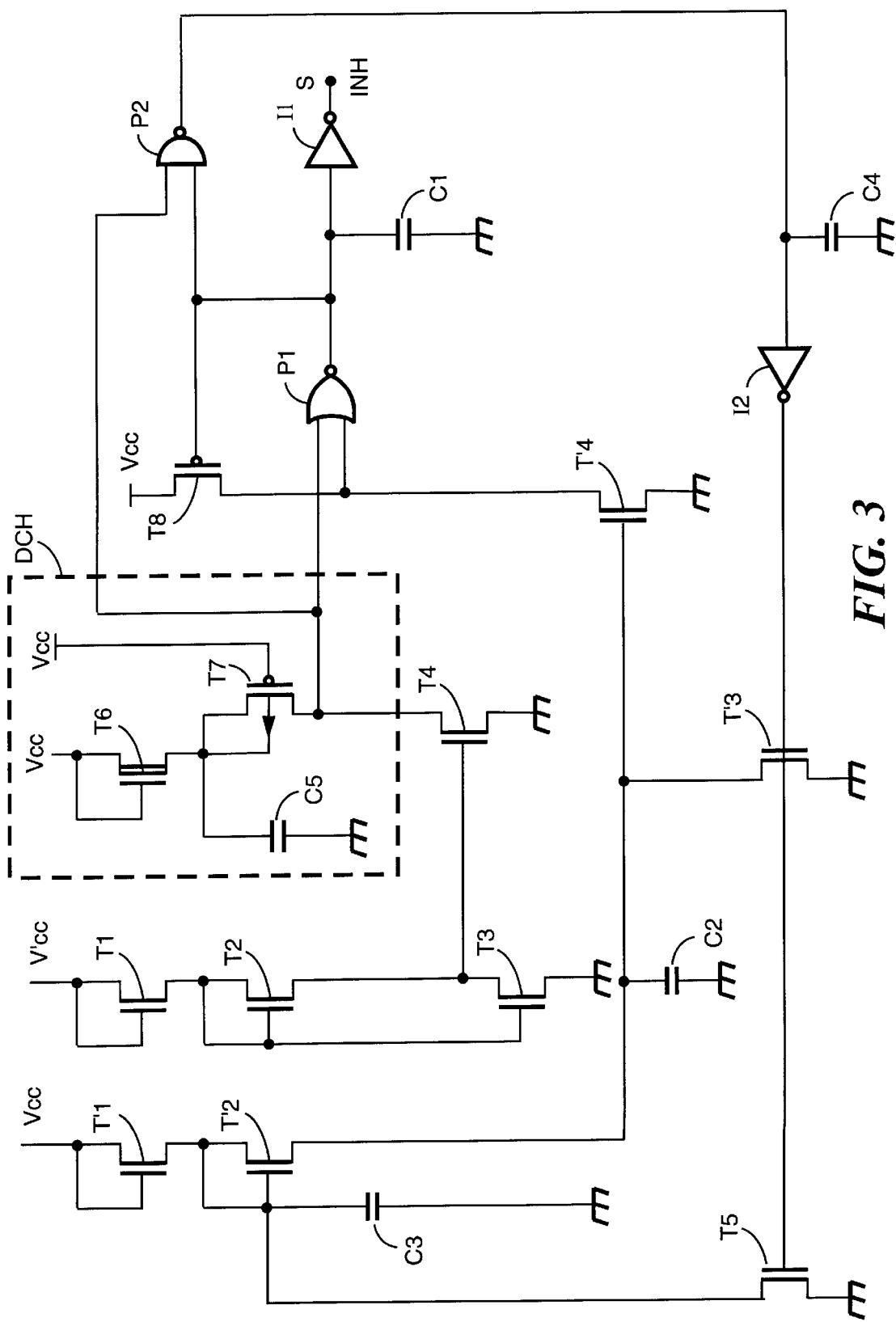
FIG. 3 shows a detailed diagram of this circuit.

A description shall now be given of a very detailed embodiment of the circuit according to the invention, with reference to FIG. 3.

This circuit is formed by means of three different types of MOS transistors: enhanced N channel transistors, enhanced P channel transistors and native N channel transistors. The native transistors have a threshold voltage that is very close to zero, and the enhanced transistors have a threshold voltage, in terms of absolute value, that is higher than that of the native transistors, for example 1 or 1.1 volts. The native N channel transistors have, as their channel region between source and drain, the P type semiconductor substrate in which all the N channel transistors of the integrated circuit are formed, without additional doping of the channel. The enhanced transistors have an additional implantation of impurities in their channel, which is a P type implantation for the N channel transistors and an N type implantation for the P channel transistors.

The threshold voltages of the transistors are used to set up the thresholds for the triggering of the inhibition signal.

The first threshold-exceeding detector DS1 has three enhanced N channel transistors T1, T2, T3 in series between Vcc and the ground, and a fourth transistor T4. T1 has its control gate and its drain connected to Vcc. T2 has its control gate and its drain connected to the source of T1. T3 has its control gate connected to that of T2 and its drain connected to the source of T2, its source being grounded. T4 has its control gate connected to the drain of T3 and its source grounded. The drain of T4 constitutes the output of the detector DS1 and is connected to the first input of the NOR gate P1. T4 is made conductive when Vcc goes beyond a threshold VS1 which is approximately equal to the sum of the threshold voltages of the enhanced N channel transistors T1, T2, T4. The small-sized transistor T3 is used especially to bias the transistors T1 and T2.

The detector DS'1 has four transistors T'1, T'2, T'3, T'4 that are mounted practically like respectively the transistors T1, T2, T3, T4. However, the command gate of T'3 is not connected to that of T'2, but it is controlled by an inverter I2 placed at output of the NAND gate P2, this being done with a view to neutralizing the output of DS'1. A capacitor C2 connected between the drain of T'2 and the ground provides for the biasing of the transistors T'4 and T'2 during the build-up of Vcc when the power is turned on. The output of the detector DS'1, taken at the drain of T'4, is connected to the second input of the gate P1.

Furthermore, there is provision preferably for a capacitor C3 between the gate of T'2 connected to the source of T'1 and the ground.

This capacitor C3 furthermore enables the biasing of the transistors T'1 and T'2 during the build-up of Vcc when the power is turned on.

This capacitor C3 may be discharged by a transistor T5 that short-circuits it when the re-triggering signal RDCL is sent out by the gate P2. The transistor T5 is controlled by the inverter I2.

A capacitor C4 is preferably placed between the input of the inverter I2 and the ground, so as to obtain a slight delay in the turning off of the transistors T'5 and T'3 with respect to the end of the re-triggering signal at output of the gate P2. Thus a period of neutralization sufficient for the detector DS'1 is ensured.

The voltage drop detector DCH comprises a native N type transistor T6 in series with a P type transistor T7, and a capacitor C5. T6 has its drain and its command gate connected to Vcc; T7 has its source connected to the source of T6, its command gate connected to Vcc and its drain constitutes the output of the detector, connected to the first input of the gate P1 and connected also to an input of the gate P2. The substrate of the transistor T7 is connected to its source. The capacitor C5 is connected between the source of the transistor T6 (namely also that of T7) and the ground.

When Vcc rises and reaches its nominal value, the P channel transistor T7 can only be off, its source being at a potential that is lower than that of its control gate. The transistor T6 on the contrary is conductive so long as the capacitor C5 is discharged. The capacitor C5 therefore gets charged, practically up to Vcc since the transistor T6 has a threshold voltage that is very close to zero.

So long as Vcc keeps its nominal value Vcc0, equal for example to 5 volts, the capacitor C5 remains charged at this nominal value of Vcc0. It cannot get discharged in T7 which is off. However, if Vcc falls below Vcc0, then the transistor T6 goes off, preventing any discharging of the capacitor towards the source at Vcc. C5 therefore keeps the voltage Vcc0. And if the voltage Vcc drops by at least a value V1 equal to the threshold voltage of the transistor P, for example 1 volt, then T7 starts conducting (since its control gate goes sufficiently below its source). The capacitor C5 then gets discharged suddenly into the transistor T4 which is conductive.

The voltage pulse that results therefrom at the first input of the gates P1 and P2 is the short pulse, mentioned with reference to FIG. 2, that prompts the reinitializing of an inhibition signal INH.

FIG. 3 again shows a P channel transistor T8, connected between Vcc and the second input of the gate P1 and controlled by the output of the gate P1. This transistor enables the second input of the gate P1 to be kept at the high logic state (and not in a floating state) during the presence of the inhibition signal INH. The transistor T8 is small enough, with respect to T'4, for the turning on of T'4 to make the gate P1 flip over (of course, when T4 is also conductive).

Figure 4:
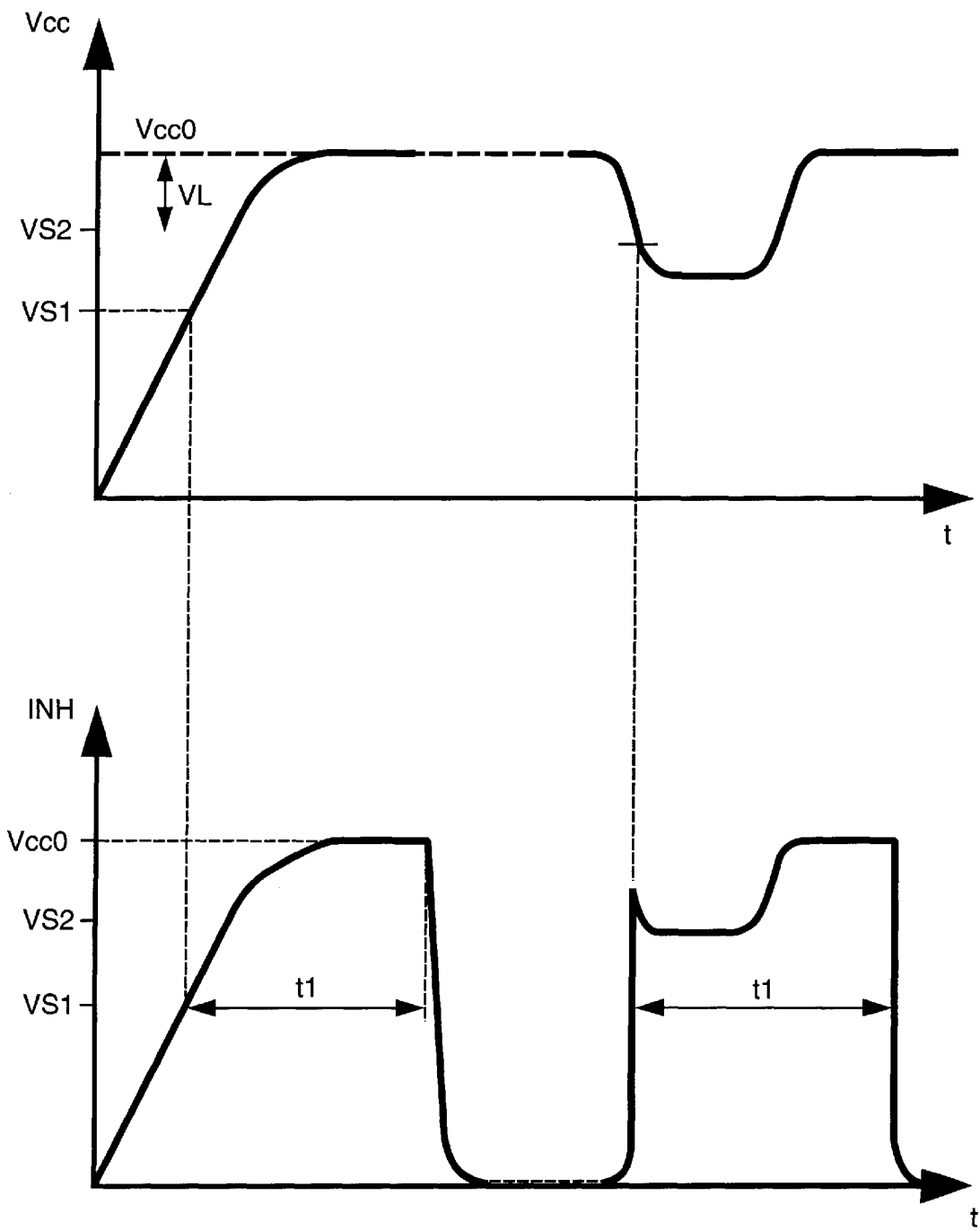
FIG. 4 shows a timing diagram of the inhibition signal in the presence of variations in the supply voltage.

FIG. 4 shows the evolution of the inhibition signal INH for an example of the evolution of the voltage Vcc: when the system is started up, Vcc inreases and the signal INH increases in following Vcc substantially. When Vcc reaches VS1, the gate P1 flips over, possibly with a slight delay due to the presence of the capacitors C2 and C3. Then the inverter I1 flips over in turn, also with a delay due to the capacitor C1. The signal INH then falls again to zero. The duration of the inhibition signal, when the system is started up, is the sum of the period taken by Vcc to reach VS1 and a period t1 corresponding to the delays introduced by the capacitors.

During this period, the voltage Vcc has, in principle, reached its nominal value Vcc0 but, in any case, the integrated circuit is allowed to work as soon as the signal INH falls back to zero.

If the supply voltage Vcc then falls to a value greater than V1, the inhibition signal is re-triggered instantaneously. The only delay in the triggering is due to the response time of the gates P1 and I1 and the discharging time of the capacitor C1, but this discharging time may be planned so that it is far smaller than the charging time. It is enough to design the last stage of P1 accordingly, with a large N channel transistor and a small P channel transistor.

The signal INH then follows the variations in voltage of Vcc. Naturally, if Vcc falls below the threshold VS1, there is a return to the standard configuration of a general re-starting operation (as in the case of starting).

However, if Vcc remains above VS1, the inhibition signal persists, and follows the variations of Vcc for a period that is substantially the same period t1 mentioned further above, resulting from the delays introduced by the various capacitors. The duration may even be longer if the time of discharging and then recharging the capacitor C4 during the reinitialization is taken into account.

What is claimed is:

1. A power-on-reset circuit in an integrated circuit supplied with a supply voltage, the power-on-reset circuit comprising:

voltage-detection circuitry connected to said supply voltage to compare said supply voltage with a voltage threshold and to produce an inhibition signal when said supply voltage is turned on and is less than said voltage threshold and to cease producing said inhibition signal at a first predetermined time after said supply voltage exceeds said voltage threshold, said inhibition signal being applied to an inhibition input of a circuit whose operation is to be inhibited when the power is turned on in the integrated circuit; and voltage-drop-detection circuitry connected to said supply voltage to detect when said supply voltage drops by at least a determined value even if said supply voltage is above said voltage threshold, and to instantaneously re-trigger said inhibition signal for a second predetermined time each and every time the voltage-drop-detection circuitry detects that said supply voltage has dropped by at least the determined value.

2. The power-on-reset circuit according to claim 1, wherein the voltage detection circuitry includes a time delay circuit connected so that said inhibition signal gets prolonged after said supply voltage exceeds said voltage threshold, and also after said re-triggering under the effect of a drop in supply voltage.

3. The circuit according to claim 2, wherein said time delay circuit prolongs said inhibition signal for approximately two milliseconds after said supply voltage exceeds said voltage threshold.

4. The circuit according to claim 1, wherein said voltage drop detection circuitry includes a first transistor with a very low threshold voltage, said first transistor having a drain and a command gate connected to said supply voltage and a source connected to a storage capacitor, and a second P channel transistor whose threshold voltage is substantially equal to the determined value, said second transistor having its source connected to the source of said first transistor and to said storage capacitor and having its command gate connected to said supply voltage, and its drain constituting an output of said voltage drop detection circuit.

5. The circuit according to claim 1, wherein the supply voltage has a normal operating value of 5 volts, the voltage threshold has a value of about 3 to 3.5 volts, and the determined value which causes the re-triggering of the inhibition signal is about 1 volt.

6. The circuit according to claim 1, wherein the inhibition signal is applied to an inhibition input of an EEPROM memory writing circuit.

7. The integrated circuit of claim 1, wherein said voltage-detection circuitry comprises two voltage-detection circuits.

8. The integrated circuit of claim 1, wherein said voltage-drop-detection circuitry comprises at least one native transistor.

9. The integrated circuit of claim 2, wherein said time-delay circuit comprises both N-channel and P-channel field effect transistors, and said voltage-drop-detection circuitry comprises at least one native transistor having a lower threshold voltage magnitude than both said N-channel and P-channel field effect transistors.

10. The power-on-reset circuit as defined in claim 1, wherein the inhibition signal produced by the voltage-detection circuitry substantially follows said supply voltage from when said supply voltage is turned on until the first predetermined time after said supply voltage exceeds said voltage threshold.

11. A power-on-reset circuit in an integrated circuit supplied with a supply voltage, the power-on-reset circuit comprising:

a first threshold-exceeding detector and a second threshold-exceeding detector, each providing a respective threshold-exceeding signal if the supply voltage goes beyond a threshold;

a first logic gate receiving said threshold-exceeding signals coming from said first and second threshold-exceeding detectors and changing state when both said detectors provide a threshold-exceeding signal;

a voltage drop detector giving a pulse signal whenever said supply voltage drops by at least a determined value, the output of said voltage drop detector being operatively connected to said first logic gate to make said first logic gate change state for a predetermined period;

a second logic gate connected to the first logic gate and the voltage drop detector, said second logic gate generating a re-triggering signal to inhibit the second threshold-exceeding detector; and an output circuit connected to said first logic gate to generate an inhibition signal of predetermined duration based on the output of said first logic gate.

12. The circuit according to claim 11, wherein said first threshold-exceeding detector is connected to a first input of said first logic gate and said second threshold-exceeding detector is connected to a second input of said first logic gate, and the second logic gate receives the output of the first logic gate and the output of the voltage drop detector, said second logic gate generating said re-triggering signal when it receives the pulse signal while the supply voltage is above the threshold.

13. The circuit according to claim 12, wherein the output circuit comprises an inverter.

14. The circuit according to claim 13, wherein the output circuit comprises a capacitor placed between the output of said first logic gate and ground.

15. The circuit according to claim 14, wherein said second threshold-exceeding detector has means to delay the transmission of a threshold-exceeding signal with respect to the time when said supply voltage goes beyond this threshold, and with respect to the end of said re-triggering signal.

16. An integrated power-on-reset circuit, for connection to a supply voltage having a normal operating value, said power-on-reset circuit comprising:

voltage-detection circuitry for detecting when the supply voltage increases to a first voltage after being turned on, the voltage-detection circuitry providing an output signal;

voltage-drop-detection circuitry for detecting when the supply voltage decreases to a second voltage, which is different from said first voltage, and providing an output signal; and time-delay and output circuitry for receiving the output of the voltage-detection circuitry and the output of the voltage-drop-detection circuitry, generating an inhibition signal from when the supply voltage is turned on until said voltage-detection circuitry detects that the supply voltage has increased to said first voltage and for a first predetermined time thereafter, and instantaneously generating an inhibition signal each and every time said voltage-drop-detection circuitry detects that the supply voltage has decreased to the second voltage and for a second predetermined time thereafter.

17. The integrated circuit of claim 16, wherein said voltage-detection circuitry comprises two voltage-detection circuits with different time constants.

18. The integrated circuit of claim 16, wherein said voltage-drop-detection circuitry comprises at least one native transistor.

19. The integrated circuit of claim 16, wherein said time-delay and output circuitry comprises both N-channel and P-channel field effect transistors, and said voltage-drop-detection circuitry comprises at least one native transistor having a lower threshold voltage magnitude than both said N-channel and P-channel field effect transistors.

20. An integrated power-on-reset circuit for connection between a reference potential and a supply voltage having a normal operating value, said power-on-reset circuit comprising:

at least one voltage-detection circuit for detecting, with reference to the reference potential, when the supply voltage increases to a first voltage after being turned on and providing an output signal;

a voltage-drop-detection circuit for detecting, with reference to the reference potential, when the supply voltage decreases from approximately the normal operating value of said supply voltage to a second voltage which is closer to the normal operating value than the first voltage is to the normal operating value, and providing an output signal; and time-delay and output circuitry coupled to the output of the voltage-drop-detection circuit and the output of the at least one voltage-detection circuit for generating an inhibition signal until said voltage-detection circuit detects that the supply voltage has increased to said first voltage after being turned on and for a first predetermined time thereafter, and instantaneously generating an inhibition signal each and every time said voltage-drop-detection circuit detects that the supply voltage has decreased to said second voltage and for a second predetermined time thereafter.

21. The integrated circuit of claim 20, wherein said at least one voltage-detection circuit comprises two voltage-detection circuits with different respective time constants.

22. The integrated circuit of claim 20, wherein said voltage-drop detection circuit comprises at least one native transistor.

23. The integrated circuit of claim 20, wherein said time-delay and output circuitry comprises both N-channel and P-channel field effect transistors, and said voltage-drop-detection circuit comprises at least one native transistor having a lower threshold voltage magnitude than both said N-channel and P-channel field effect transistors.

24. An integrated power-on-reset circuit for connection to a supply voltage having a normal operating value, said power-on-reset circuit comprising:

a voltage-detection circuit driving an output signal into a first state when the supply voltage increases to a first voltage; the voltage-detection circuit having at least one time-constant associated therewith;

a voltage-drop-detection circuit detecting when the supply voltage a predetermined amount decreases was while said output signal of said voltage-detection circuit is in said first state, so as to prevent said voltage detection circuit from driving said output signal into the first state for a predetermined period; and time-delay and output circuitry generating an inhibition signal prior to said output of said voltage-detection circuit being in said first state and for a predetermined time thereafter.

25. The integrated circuit of claim 24, wherein said at least one voltage-detection circuit comprises two voltage-detection circuits with different respective time constants.

26. The integrated circuit of claim 24, wherein said voltage-drop-detection circuit comprises at least one native transistor.

27. The integrated circuit of claim 24, wherein said time-delay and output circuitry comprises both N-channel and P-channel field effect transistors, and said voltage-drop-detection circuit comprises at least one native transistor having a lower threshold voltage magnitude than both said N-channel and P-channel field effect transistors.

28. The integrated circuit of claim 24, wherein said normal operating value is positive.

29. An integrated power-on-reset circuit for connection to a supply voltage having a normal operating value, said power-on-reset circuit comprising:

a voltage-detection circuit including first and second voltage detectors, the voltage-detection circuit driving an output signal into a first state when the supply voltage increases to a first voltage; each of said voltage detectors having a time-constant associated therewith;

a voltage-drop-detection circuit detecting when the supply voltage a predetermined amount decreases a predetermined amount while said output signal driven by said voltage-detection circuit is in said first state, so as to prevent said voltage-detection circuit from driving said output signal into the first state for a predetermined period; and time-delay and output circuitry generating an inhibition signal prior to said output signal driven by said voltage-detection circuit being in said first state and for a predetermined time thereafter.

30. The integrated circuit of claim 29, wherein said first and second voltage-detection circuits have different respective time constants.

31. The integrated circuit of claim 29, wherein said voltage-drop-detection circuit comprises at least one native transistor.

32. The integrated circuit of claim 29, wherein said time-delay and output circuitry comprises both N-channel and P-channel field effect transistors, and said voltage-drop-detection circuit comprises at least one native transistor having a lower threshold voltage magnitude than both said N-channel and P-channel field effect transistors.

33. A method for generating power-on-reset inhibition signals in an integrated circuit, said method comprising the steps of:

monitoring the supply voltage with an inhibition circuit;

outputting an inhibition signal from said inhibition circuit to other circuits on the integrated circuit whenever a voltage-detection circuit detects that, after being turned on, the supply voltage has not reached a first voltage and for a predetermined time after the supply voltage has reached said first voltage; and instantaneously outputting an inhibition signal from said inhibition circuit to other circuits on the integrated circuit each and every time a voltage-drop-detection circuit detects that the supply voltage has decreased to a second voltage and for a predetermined time thereafter.

34. The method of claim 33, wherein said voltage-drop-detection circuit comprises at least one native transistor.

35. The method of claim 33, wherein said inhibition circuit comprises both N-channel and P-channel field effect transistors, and said voltage-drop-detection circuit comprises at least one native transistor having a lower threshold voltage magnitude than both said N-channel and P-channel field effect transistors.

36. The method of claim 33, wherein said first voltage is positive.

* * * * *